United States Patent [19]

Nishizawa et al.

[11] 4,318,971

[45] Mar. 9, 1982

[54] METHOD OF FORMING FLUORESCENT SCREEN OF COLOR PICTURE TUBE

[75] Inventors: Masahiro Nishizawa; Kiyoshi Miura; Hiroshi Yokomizo; Osamu Sasaya, all of Mobara; Hajime Morishita, Tokyo; Shoichi Uchino, Hachioji, all of Japan

[73] Assignee: Hitachi, Ltd., Tokyo, Japan

[21] Appl. No.: 234,012

[22] Filed: Feb. 12, 1981

[30] Foreign Application Priority Data

Apr. 4, 1980 [JP] Japan ................................. 55-43587

[51] Int. Cl.³ .............................................. G03C 5/00
[52] U.S. Cl. .................................... 430/28; 427/53.1; 427/68; 430/25; 430/26
[58] Field of Search ......................... 430/25, 26, 28; 427/53.1, 68

[56] References Cited

U.S. PATENT DOCUMENTS 4,247,612  1/1981  Nishizawa et al. ................. 430/28
4,269,918  5/1981  Nonogaki et al. ................... 430/28
4,273,842  6/1981  Nonogaki et al. ................... 430/25

Primary Examiner—James R. Hoffman
Attorney, Agent, or Firm—Charles E. Pfund

[57] ABSTRACT

The photosensitive resin which exhibits stickiness by photo-reaction is added with a binder which does not substantially raise dark reaction, and a resultant mixture is applied onto the inner surface of face panel of the color picture tube to form a film. Portion of the film where powdery material is going to be applied is exposed to light and rendered sticky. Phosphor powder, when used as the powdery material, is applied to the sticky portion and adhered thereto to form a fluorescent screen.

2 Claims, 2 Drawing Figures

METHOD OF FORMING FLUORESCENT SCREEN OF COLOR PICTURE TUBE

BACKGROUND OF THE INVENTION

The present invention relates to the method of forming a fluorescent screen of a color picture tube by way of so called dry process wherein powdery phosphor is applied to the face panel.

The fluorescent screen of a color picture tube is formed of a layer of phosphor dots or stripes of three primary colors arranged precisely at predtermined positions, so that picture elements of the screen can luminesce at three primary colors. A widely-used method of forming the fluorescent screen is that a photosensitive material is applied to the inner surface of the face panel to form a film, portion of the film where the phosphor layer is going to be formed is exposed to light through a shadow mask, and the phosphor layer is formed by use of photo-reaction which takes place at the exposed portion. This method falls into wet process which is used in general and dry process which has been developed recently. One may refer to U.S. Pat. application Ser. No. 895,372, filed Apr. 11, 1978, now U.S. Pat. No. 4,273,842, disclosing a dry process.

According to such a dry process, a photosensitive resin mainly containing diazonium salt is applied to the inner surface of a face panel to form a film. Then portion of the film where a phosphor layer is going to be formed is exposed to light so that zinc chloride having the moisture absorptive characteristic is produced in the exposed portion of the film by photo-reaction. The exposed portion becomes sticky when it absorbs moisture in the air. Next, phosphor powder having a desired luminous color is sprayed onto the inner surface of the face panel, so that the phosphor powder adheres only to the sticky portion of the film. This process is carried out for each of green, blue and red phosphors in the case of a color picture tube. The phosphor layers formed in this manner has the water-soluble characteristic and cannot sustain filming which will be carried out subsequently as a post processing, and therefore a fixing process is carried out using ammonia gas so that the phosphor layers are made water-insoluble. However, the additional fixing process is not profitable for productivity, and there has been proposed a method for solving this problem wherein a photosensitive binder such as ammonium bichromate is beforehand added to the photosensitive resin. (See U.S patent application Ser. No. 64,739, now U.S. Pat. No. 4,247,612).

However, the photosensitive resin mixed with the photosensitive binder is so sensitive to dark reaction that the nature of the photosensitive resin changes by dark reaction. Therefore, the mixture cannot be stocked and must be used up at once, resulting in a poor productivity.

The "dark reaction" herein means that the binder is reacted with light of wavelengths other than the characteristic wavelength of the binder, or with heat.

SUMMARY OF THE INVENTION

The present invention is contemplated to solve such deficiencies in prior art method, and it is an object of the invention to provide a method of forming a fluorescent screen of a color picture tube by use of photosensitive resin containing a binder which does not raise dark reaction, so that productivity is improved.

According to this invention, a binder containing bivalent or more metallic salt such as chrome alum which does not raise dark reaction is added to a photosensitive resin mainly containing diazonium salt.

DESCRIPTION OF PREFERRED EMBODIMENTS

Figure 1:
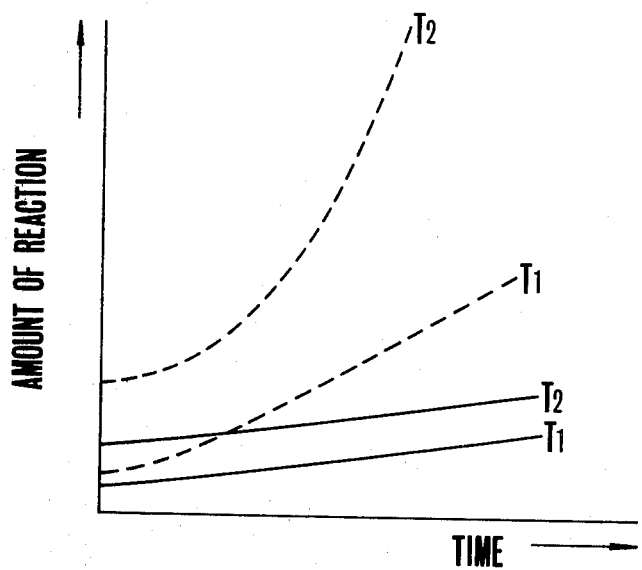
FIGS. 1 and 2 are graphs useful in explaining dark reaction characteristics.
Figure 2:
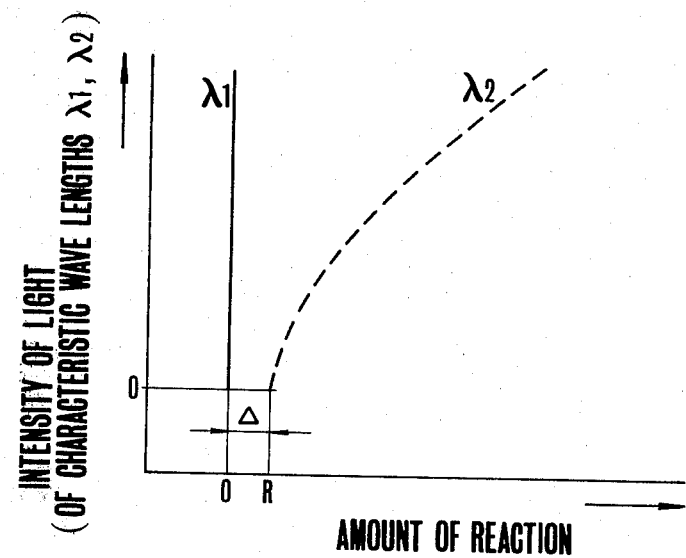

Although dark reaction per se is well known, for better understanding of the present invention, dark reaction characteristics will be described in brief with reference to FIGS. 1 and 2. As shown at solid line curves in FIG. 1, under a temperature condition ($T_1 < T_2$), a binder as used in the present invention does not exhibit substantially increasing reaction whereas the conventional photosensitive binder exhibits considerably increasing reaction as shown at dotted line curves. FIG. 2 shows the relation between intensity of light having a wavelength characteristic to those binders and the amount of reaction. In the binder of the present invention, when light intensity of a wavelength $\lambda_1$ characteristic to this binder is zero, the amount of reaction is zero correspondingly as shown at solid line curve whereas in the conventional photosensitive binder, even when light intensity of a wavelength $\lambda_2$ characteristic to this binder is zero, reaction is raised by an amount R as shown at dotted line curve. Thus, since intensity of $\lambda_2$ characteristic wavelength light is zero, the conventional binder undergoes photo-reaction with light of other wavelengths and/or thermal reaction, exhibiting dark reaction by $\Delta$ as compared with the binder of the invention, and is difficult to store and reuse.

The invention will now be described in detail by way of example.

A photosensitive resin mainly containing diazonium salt is mixed with chrome alum (chromium sulfate potassium: $K_2Cr_2(SO_4)_4 \cdot 24H_2O$) as a binder containing bivalent or more metallic salt which does not raise dark reaction, so that a mixture with the following composition is prepared. The composition rate is expressed in weight percent.

- alginic acid propyleneglycol ester—0.6%
- P.N.N. dimethylaminobenzene diazonium zinc chloride—3.0%
- pluronic L-92 (surfactant)—0.003%
- chrome alum—0.08%
- water—remainder The photosensitive resin mixture as mentioned above is applied to the inner surface of the face plate of a 14 inch type color picture tube by centrifugal method, so that a film having a uniform thickness of 0.6 to 1.0 micron is formed. After the film has been dried, the portion of the film where the green phosphor layer is going to be formed is exposed to light at an intensity of 15 to 20 W/m² for 2 to 3 minutes through a shadow mask mounted to the face panel. Consequently, diazonium salt in the exposed portion resolves into moisture-absorptive zinc chloride, and it absorbs moisture in the air to become sticky. The proper atmospheric temperature is $25 \pm 5$ C. and humidity is $55 \pm 6\%$. Next, green phosphor powder is sprayed onto the inner surface of the face panel, and the face panel is blown by a compressed air. Then, green phosphor powder adheres only to the sticky portion by an amount of 2.5 to 3 mg/cm³, and a green phosphor layer is formed.

After the processes of light exposure and application of phosphor powder for blue and red phosphors, three-color phosphor layer dots or stripes are formed on the inner surface of the face panel. After that, the phosphor layer is dried with a cover placed on it, so that the layer is fixed.

In the phosphor layer created in this method, a net structure is made by chrome alum and an alginic acid propylene glycol ester contained in the film, and when the film swells by absorbing moisture, it catches phosphors in its spaces. When the film is dried, it contracts to hold the phosphors firmly so that they adhere firmly on the film. This film is made water-insoluble and it will not swell again afterward when wetted by water.

Since the mixture does not contain active hexavalent chrome such as ammonium bichromate used in the conventional method, its characteristics are not changed by dark reaction, and it can be used repeatedly. Thus, productivity of manufacturing color picture tubes is improved.

Chrome alum used for the mixture may be replaced with chrome ammonium alum (chromium sulfate ammonium: $Cr_2(NH_4)_2(SO_4)_4\ 24H_2O$) and chromium nitrate ($CR(NO_3)_3\ 9H_2O$). In the above embodiment, a binder of chrome alum containing trivalent $Cr^{3+}$ is used; however, a binder of iron alum containing trivalent $Fe^{3+}$ may also be used.

For example, a mixture of the following composition may be used.

alginic acid propyleneglycol ester—0.6%
P.N.N. dimethylaminobenzene diazonium zinc chloride—3.0%
pluronic L-92 (surfactant)—0.003%
ferrous chloride—0.1%
water—remainder Ferrous chloride may be replaced with any of iron alum (ferric ammonium sulfate $Fe_2(SO_4)_3(NH_4)_2SO_4 24H_2O$), ferric nitrate ($Fe(NO_3)_3 9H_2O$) and ferric chloride ($FeCl_3 6H_2O$).

A mixture of the following composition is also possible by use of a binder such as ammonium alum containing $Al^{3+}$.

alginic acid propyleneglycol ester—0.6%
P.N.N. dimethylaminobenzene diazonium zinc chloride—3.0%
pluronic L-92 (surfactant)—0.003%
ammonium alum (aluminum ammonium sulfate: $Al_2(SO_4)_3(NH_4)_2SO_4.24H_2O$)—0.1%
water—remainder Aluminum alum may be replaced with any of potassium alum (aluminum potasium sulfate: $K_2Al_2(SO_4)_4.24H_2O$), and aluminum chloride ($AlCl_3.6H_2O$).

It is also possible to use a binder such as lead nitrate ($Pb(NO_3)_2$) containing $Pb^{+2}$, barium chloride ($BaCl_2.2H_2O$) containing $Ba^{2+}$, and cupric chloride ($CuCl_2.2H_2O$) containing $Cu^{2+}$.

Especially, chrome alum and aluminum alum are preferable since they have less secondary affect upon the picture tube and their contents are, preferably, more than 0.01% but so limited as not to adversely affect the photo-reactive materials.

As has been described, in the invention, the photo-stickiness agent (photosensitive material) for use in dry process undergoes photolysis and phosphor is adhered thereto, but the binder per se does not exhibit photo-reactive behavior and dark reaction thereof is much less than that of the conventional photosensitive binder. Accordingly, the life of the liquid can be prolonged for repetetive use. Moreover, the mixture can be stocked, facilitating the process scheduling, and also material can be saved. Thus, productivity of manufacturing color picture tubes can be improved.

What is claimed is:

1. In a method of forming a fluorescent screen of a color picture tube comprising: applying a photosensitive resin mainly containing diazonium salt to the inner surface of a face panel of the color picture tube so that a photosensitive resin film is formed on said panel, making sticky the portion of said film where a phosphor layer is going to be formed by photosensitive reaction and absorption of moisture in the air, and adhering powdery material such as phosphor powder and/or graphite powder on said sticky portion of said film, the improvement wherein a binder which does not substantially raise dark reaction is added to said photosensitive resin and resultant mixture is applied to said face panel to form a film.

2. The method for formation in accordance with claim 1, wherein said binder is a bivalent or more metallic salt.

* * * * *